United States Patent [19]
Harada

[11] Patent Number: 5,070,377
[45] Date of Patent: Dec. 3, 1991

[54] SEMICONDUCTOR DEVICE AND METHOD OF MANUFACTURING THE SAME

[75] Inventor: Masana Harada, Itami, Japan

[73] Assignee: Mitsubishi Denki Kabushiki Kaisha, Tokyo, Japan

[21] Appl. No.: 598,145

[22] Filed: Oct. 16, 1990

[30] Foreign Application Priority Data

Feb. 15, 1990 [JP] Japan ................................. 2-34661

[51] Int. Cl.$^5$ ........................................... H01L 29/78
[52] U.S. Cl. .................................. 357/23.4; 357/23.8; 357/34; 357/41; 357/46; 357/58; 357/86
[58] Field of Search ..................... 357/23.4, 41, 46, 58, 357/23.8, 34, 86

[56] References Cited

U.S. PATENT DOCUMENTS 3,697,827 10/1972 Simon .
4,851,721 7/1989 Okitaka .
4,882,717 11/1989 Hayakawa et al. .

FOREIGN PATENT DOCUMENTS 0133642 3/1985 European Pat. Off. .

OTHER PUBLICATIONS

Shimizu et al.—IEEE Transactions on Electron Devices—vol. Ed-31, No. 9, Sep. 1984.
"High-Speed Low-Loss p—n Diode Having a Channel Structure", vol. Ed-31, No. 9, IEEE Transactions of Electron Devices, 09/84, pp. 1314–1319.
"High Current Characteristics of Asymmetrical p—i—n Diodes Having Low Forward Voltage Drops", vol. Ed-23, No. 8, IEEE Transactions on Electron Devices, 08/76, pp. 945–949.

Primary Examiner—Edward J. Wojciechowicz
Attorney, Agent, or Firm—Oblon, Spivak, McClelland, Maier & Neustadt

[57] ABSTRACT

An N drift region (42) is provided in its surface with a P+ well region (43) of a square ring shape and a P region (51) formed in the center of the square ring. The P region (51) is relatively low in impurity concentration and relatively small in thickness while the P+ well region (43) is relatively high in impurity concentration and relatively large in thickness. The P region (51) of low impurity concentration is lower in built-in voltage than P+ well region (43) of high impurity concentration, so that most part of a forward current of a diode consisting of the N drift region (42) and the P+ well and P regions (43, 51) can flow through the P region (51). Because of the low impurity concentration and small thickness of the P region (51), the rate of minority carriers in the forward current is low. Thus, a reverse recovery time of the diode can be shortened.

11 Claims, 6 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly, it relates to an improvement for a short reverse recovery time in a power switching device, such as a power MOSFET or a shorted collector IGBT (Insulated Gate Bipolar Transistor), which is employed in an inductive load circuit such as an inverter circuit for driving a motor.

2. Description of the Background Art

Figure 1:
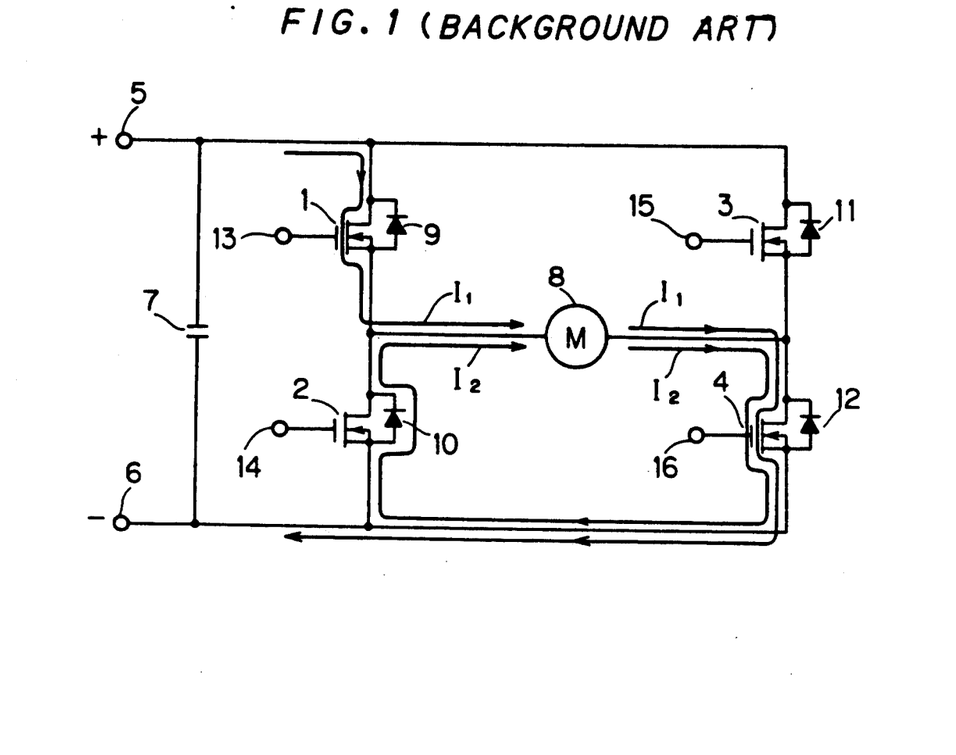
FIG. 1 is a diagram showing a conventional half-bridge circuit.

FIG. 1 is a circuit diagram showing a conventional half-bridge circuit employing a power MOSFET, for driving a motor. Referring to FIG. 1, power MOSFETs 1 and 2, and power MOSFETs 3 and 4 are in totem-pole-connection with each other between positive and negative power supply terminals 5 and 6. Also a capacitor 7 is connected between the positive and negative power supply terminals 5 and 6. A motor 8 is connected between the junction of the power MOSFETs 1, 2 and the junction of the power MOSFETs 3, 4. Freewheel diodes 9 to 12 are connected to the power MOSFETs 1 to 4 in parallel, respectively. A control voltage applied to gate terminals 13 to 16 control the power MOSFETs 1 to 4 to turn On or Off.

When the FETs 1 and 4 are in an on-state, a supply current $I_1$ flows in the motor 8. Then, when the FET 1 turns Off, a circulating current $I_2$ flows through the freewheel diode 10. Turning the FET 4 Off and turning the FETs 2 and 3 On cause a supply current reverse to the supply current $I_1$ in direction to flow in the motor 8. When this supply current flows, the free wheel diode 10 enters a reverse recovery stage. Excessive carriers which have been accumulated are swept out and thereby the freewheel diode 10 turns Off.

When the freewheel diodes 9 to 12 require a long reverse recovery time, the resultant heavy switching loss hurts the efficiency. Therefore, in general, external discrete high speed recovery diodes are used as the freewheel diodes 9 to 12 to shorten the reverse recovery time. On the other hand, a MOSFET has the structure having a diode parastically formed in a device, and conventionally the trial for using the diode as a free-wheel diode has been made.

Figure 2:
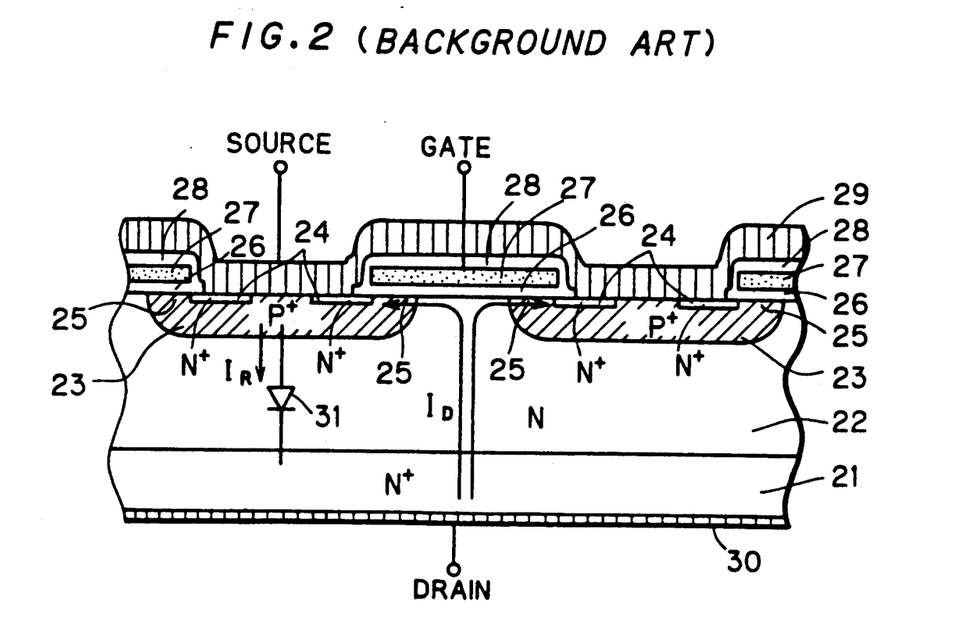
FIG. 2 is a sectional view showing a structure of a conventional MOSFET.

FIG. 2 is a sectional view showing a structure of a conventional vertical-type n channel MOSFET. Referring to FIG. 2, an N (or N−) drift region 22 is formed on an N+ drain region 21, and P+ well regions 23 are formed in the surface of the drift region 22. N+ source regions 24 are formed in the surface of each P+ well region 23, and regions 25 close to the surface of the P+ well regions 23 between the surfaces of the N+ source regions 24 and the surface of the drift region 22 comes to function as channel regions. Gate electrodes 27 are formed on the channel regions 25 through gate insulating films 26. Other insulating films 28 cover the gate electrodes 27 to insulate the gate electrodes 27. Over the entire surface, a source electrode 29 is provided connecting with the N+ source regions 24 and the P+ well regions 23. A drain electrode 30 is provided on the bottom surface of the N+ drain region 21.

In the MOSFET shown in FIG. 2, when a positive voltage is applied to the gate electrodes 27, the channel regions 25 are inverted into an N-type to form inversion layers, and a drain current $I_D$ flows from the drain electrode 30 to the source electrode 29 through the inversion layer as shown in FIG. 2. When a negative voltage is applied to the gate electrodes 27, the inversion layers in the channel regions 25 disappear, and thus the MOSFET turns Off.

The MOSFET shown in FIG. 2 parastically includes a P+IN+ diode 31 formed of the P+ well region 23, the N drift region 22 and the N+ drain region 21. Thus, the diode 31 can be used as each of the free wheel diodes 9 to 12 shown in FIG. 1. Symbols $I_R$ in FIG. 2 designates a flow of a circulating current.

Figure 3:
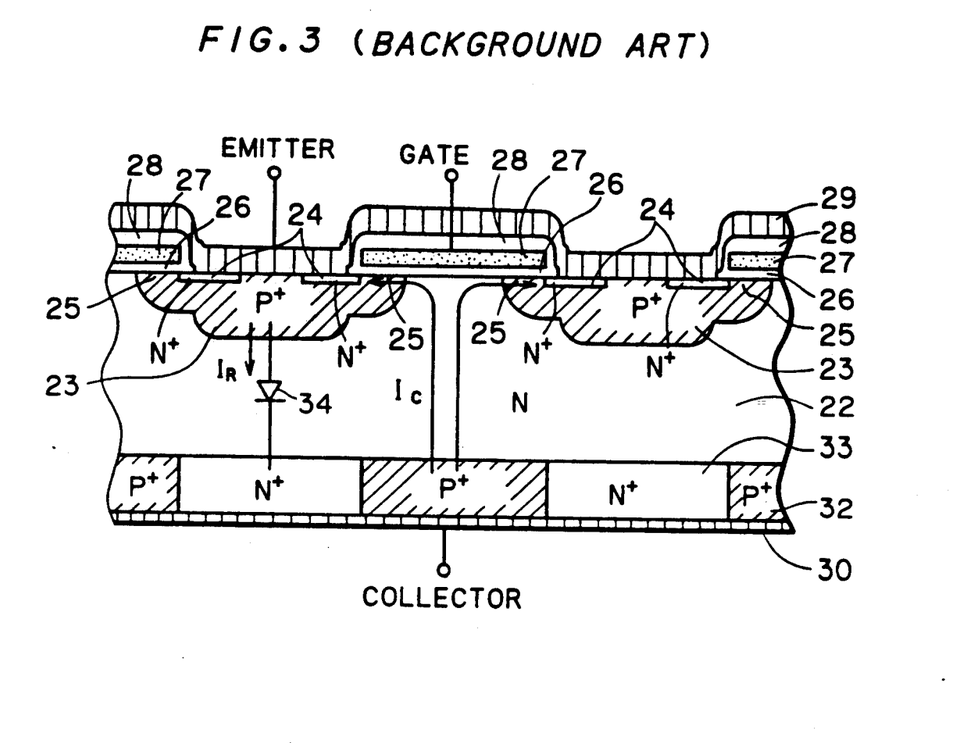
FIG. 3 is a sectional view showing a structure of a conventional collector shorted IGBT.

FIG. 3 is a sectional view showing a structure of a conventional shorted collector IGBT. This shorted collector IGBT has a structure similar to that of the MOSFET shown in FIG. 2 except that, instead of the N+ drain region 21 in FIG. 2, P+ collector regions 32 and N+ collector shorting regions 33 are alternately disposed on the bottom surface of the N drift region 22. A P+IN+ diode 34 similar to the diode 31 shown in FIG. 2 is parastically formed of the P+ well region 23, the N drift region 22 and the N+ collector shorting region 33. Thus, when the collector shorted IGBT shown in FIG. 3 is used instead of the power MOSFETs 1 to 4 in FIG. 1, it is possible that the diode 34 is used as each of the free wheel diodes 9 to 12.

When the diode 31 in FIG. 2 or the diode 34 in FIG. 3 is used as each of the free wheel diodes 9 to 12, there is the advantage that it is unnecessary to separately provide external diodes as the free wheel diodes 9 to 12 and, therefore, such a trial has conventionally been made. However, in order to use the diodes 31 and 34 as free wheel diodes, a period of time required for reverse recovery in the diodes 31 and 34 must be very short. Thus, to shorten the lifetime of excessive minority carriers, a lifetime control like a heavy metal diffusion or an electron ray irradiation must be performed.

Such a lifetime control shortens the lifetime of carriers in the drift layer 22, and causes the increase of a voltage drop (i.e., the increase of an On state voltage) in the drift layer 22 in the On state in the ordinary operation. Therefore, a sufficient optimization is necessary. Moreover, it is known that a lifetime control exerts large influences upon electric characteristics of the device, such as an increase in leak current due to a heavy metal diffusion and a variation in threshold voltage caused by an irradiation of electron rays, other than the increase of the On state voltage, and this must be taken into consideration to perform a lifetime control. Thus, it is very difficult to sufficiently shorten a period of time required for the reverse recovery of the diodes 31 and 34 through the lifetime control with the electric characteristics of the device kept well. Eventually, since a sufficient high-speed can not be obtained, there arises the problem that external free wheel diodes must be added.

SUMMARY OF THE INVENTION

A semiconductor device in accordance with the present invention comprises a first conductivity type semiconductor layer having first and second major surfaces, a second conductivity type first semiconductor region selectively formed in the first major surface of the semiconductor layer, the first semiconductor region being composed of a first portion of relatively low impurity concentration and relatively small thickness existing in a center of the first semiconductor region and a second portion of relatively high impurity concentration and relatively large thickness existing adjacently to and outside the first portion, a first conductivity type second semiconductor region selectively formed in a surface of the second portion of the first semiconductor region, a portion near the surface of the second portion of the first semiconductor region between surfaces of the semiconductor layer and the second semiconductor region being defined as a channel, an insulating film formed on the channel, a gate electrode formed on the insulating film, a first main electrode formed on the first and second semiconductor regions, and a second main electrode formed in a side of the second major surface of the semiconductor layer.

A method of manufacturing a semiconductor device in accordance with the present invention comprises the steps of preparing a first conductivity type semiconductor layer having first and second major surfaces, selectively forming a second conductivity type first semiconductor region in the first major surface of the semiconductor layer, the first semiconductor region being composed of a first portion of relatively low impurity concentration and relatively small thickness existing in a center of the first semiconductor region and a second portion of relatively high impurity concentration and relatively large thickness existing adjacently to and outside the first portion, selectively forming a first conductivity type second semiconductor region in a surface of the second portion of the first semiconductor region, a portion near the surface of the second portion of the first semiconductor region between surfaces of the semiconductor layer and the second semiconductor region being defined as a channel, forming an insulating film on the channel, forming a gate electrode on the insulating film, forming a first main electrode on the first and second semiconductor regions, and forming a second main electrode formed in a side of the second major surface of the semiconductor layer.

According to the present invention, a first semiconductor region consists of a first portion formed in the center and a second portion formed adjacent to and outside the first portion, the first part being relatively low in impurity concentration and relatively small in thickness, the second part being relatively high in impurity concentration and relatively large in thickness. The first portion of low impurity concentration is lower in built-in voltage than the second portion of high impurity concentration, and hence most part of a forward current in a diode consisting of a semiconductor layer and the first semiconductor region flows through the first portion which is low in built-in voltage. Because of the low impurity concentration and small thickness of the first portion, the rate of minority carriers in the forward current is low. Thus, a reverse recovery time of the diode is shortened. In the Off state of the diode, a shielding effect caused by an extension of a depletion layer from the second portion of the first semiconductor region reduces an influence which the first portion exerts on a breakdown voltage, so that a high breakdown voltage can be implemented.

Accordingly, it is an object of the present invention to provide a semiconductor device which is provided with an internal diode requiring a sufficiently short reverse recovery time without a lifetime control and is applicable to a high voltage applying use, and a method of manufacturing the semiconductor device.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 4:
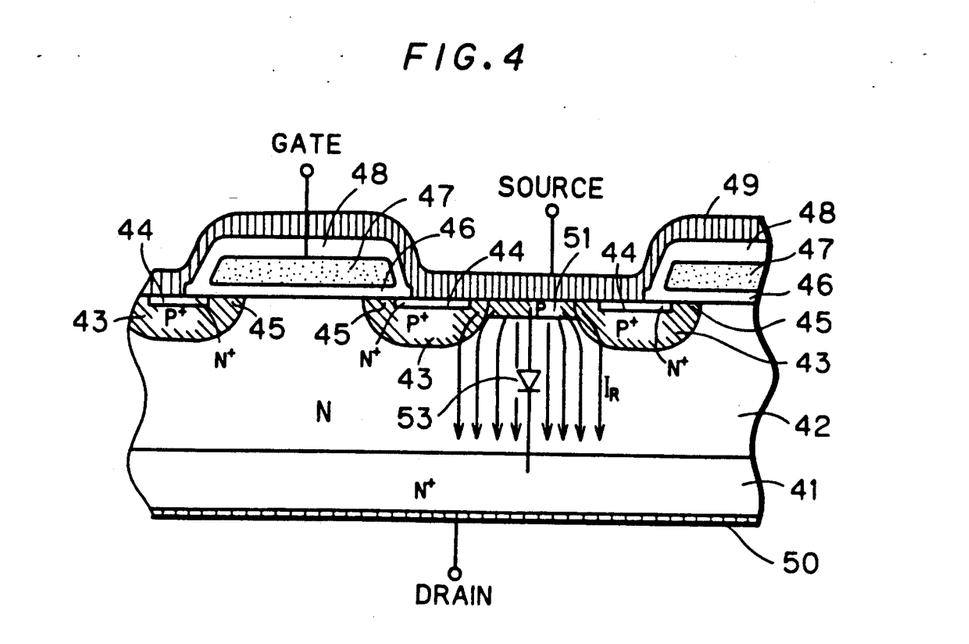
FIG. 4 is a sectional view showing a structure of a MOSFET as an embodiment of a semiconductor device according to the present invention.
Figure 5:
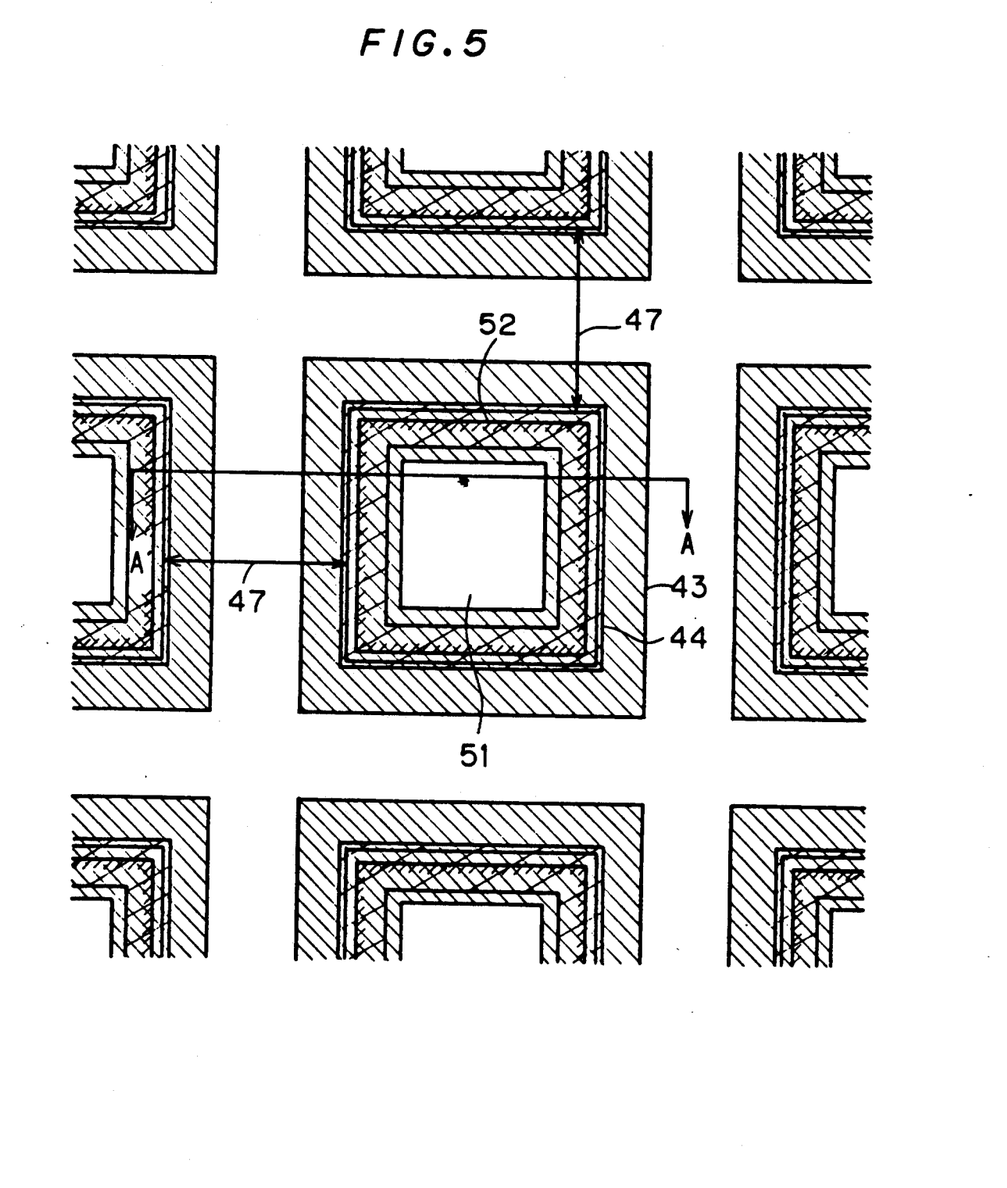
FIG. 5 is a plan view showing a plan structure of the MOSFET in FIG. 4.

FIG. 4 is a sectional view showing a structure of a vertical n-channel MOSFET which is an embodiment of a semiconductor device according to the present invention. FIG. 5 is a plan view of FIG. 4. FIG. 4 shows the structure in section along the line A—A' in the plan view of FIG. 5.

As shown in FIG. 4, an N (or N−) drift region 42 is formed on an N+ drain region 41, and P+ well regions 43 are formed in the surface of the drift region 42. Each P+ well region 43 has a shape of a square ring, as will be recognized in the plan view of FIG. 5. In the center portion of the square ring of each P+ well region 43, a P region 51 is provided. Specifically, the relatively thick P+ well region 43 provided adjacent to the P region 51 in the surface of the drift region 42 surrounds the relatively thin P region 51 provided in the surface of the drift region 42.

N+ source regions 44 are formed in the surface of each P+ well region 43. Regions 45 in the vicinity of the surface of each P+ well region 43 between the surface of the N+ source regions 44 and the surface of the drift region 42 serve as channel regions. Gate electrodes 47 are formed on the channel regions 45 through gate insulating films 46. The gate electrodes 47 are insulated by being covered with insulating films 48. Over the entire surface, there is provided a source electrode 49 which is connected with the N+ source regions 44, the P+ well regions 43 and the P regions 51. A drain electrode 50 is provided on the bottom surface of the N+ drain region 41. In FIG. 5, reference numeral 52 denotes a contact hole of the source electrode 49.

The basic operation of the MOSFET shown in FIG. 4 is the same as that of the MOSFET shown in FIG. 2. Specifically, when a positive voltage is applied to the gate electrodes 47, the channel regions 45 are inverted into an N-type to form inversion layers, and a drain current flows from the drain electrode 50 to the source electrode 49 through the inversion layers. When a negative voltage is applied to the gate electrodes 47, the inversion layers of the channel regions 45 disappear, and thus the MOSFET turns Off.

The MOSFET shown in FIG. 4 comprises a PIN+ diode 53 consisting of the P region 51, the N drift region 42 and the N+ drain region 41. In FIG. 4, symbol $I_R$ denotes a flow of a circulating current when the diode 53 is used as a free wheel diode. Although a P+IN+ diode is also formed of the P+ well region 43, the circulating current $I_R$ mostly flows through the P region 51 because the N drift region 42 and the N+ drain region 41, the P region 51 is lower in impurity concentration than the P+ well region 43 and, therefore, a built-in voltage (a voltage at which a forward current begins to flow in PN junction) of the P region 51 is smaller than that of the P+ well region 43.

The P region 51 has a relatively low impurity concentration and has a relatively small thickness. For that reason, an amount of holes injected from the P region 51 to the N drift region 42 is small. In other words, the rate of the holes which are minority carriers in the circulating current $I_R$ is low. For that reason, during the reverse recovery stage of the PIN+ diode 53, a disappearance of carriers is rapidly effected, so that a period of time required for the reverse recovery can be shortened.

The P region 51 is surrounded by the P+ well region 43 larger in thickness than the P region 51. Thus, when a PN junction consisting of the P+ well region 43 and the P region 51 and the N drift region 42 is reversely biased, an influence exerted upon a breakdown voltage of the P region 51 is reduced because of a shielding effect caused by a depletion layer extending from the interface of the P+ well region 43 and the N drift region 42 into the N drift region 42. Thus, there arises no hindrance of implementing a high breakdown voltage due to provision of the P region 51. To implement a high breakdown voltage, the thickness of the P region 51 to the thickness of the P+ well region 43 may be optimized in accordance with the required breakdown voltage.

As previously mentioned, the MOSFET according to this embodiment shown in FIG. 4 is provided with the internal diode 53 requiring a short reverse recovery time and is satisfactorily applicable to a high voltage applying use. Thus, in an inverter circuit shown in FIG. 1, the external free wheel diodes 9 to 12 are unnecessary when the MOSFET shown in FIG. 4 is used as each of the power MOSFET 1 to 4.

Figure 6A:
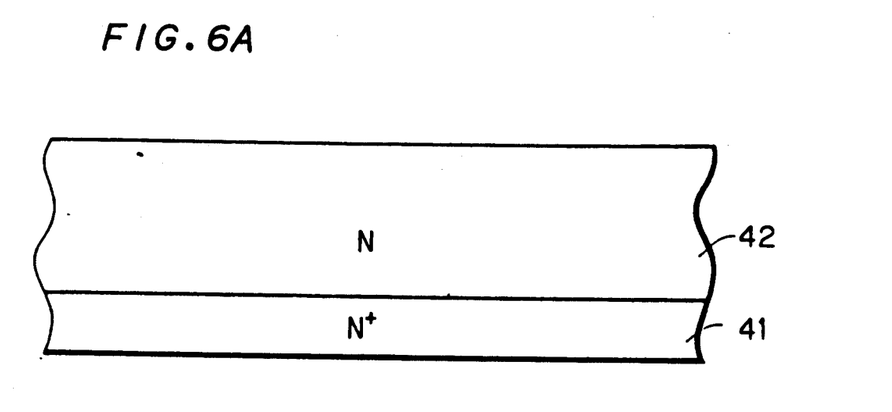
FIGS. 6A to 6F are sectional views showing the steps of manufacturing the MOSFET in FIG. 4.
Figure 6B:
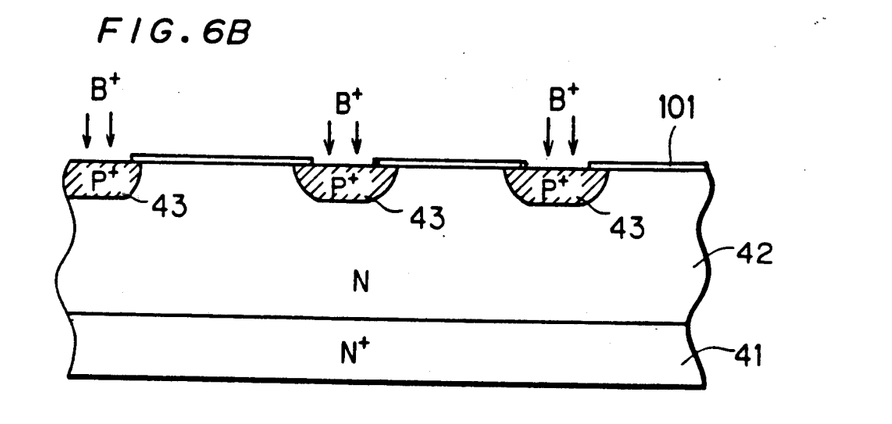

FIGS. 6A to 6F are sectional views showing an example of the steps of manufacturing the MOSFET shown in FIG. 4. First, as shown in FIG. 6A, an original substrate is prepared, wherein an N-type semiconductor layer to be the N drift region 42 is formed on an N+-type semiconductor substrate to be the N+ drain region 41. Then, as shown in FIG. 6B, P-type impurities such as boron are selectively introduced into specified portions of the N drift region 42 with a mask 101 by means of ion implantation, gas diffusion or the like so as to form the P+ well regions 43 having a relatively high impurity concentration.

Figure 6C:
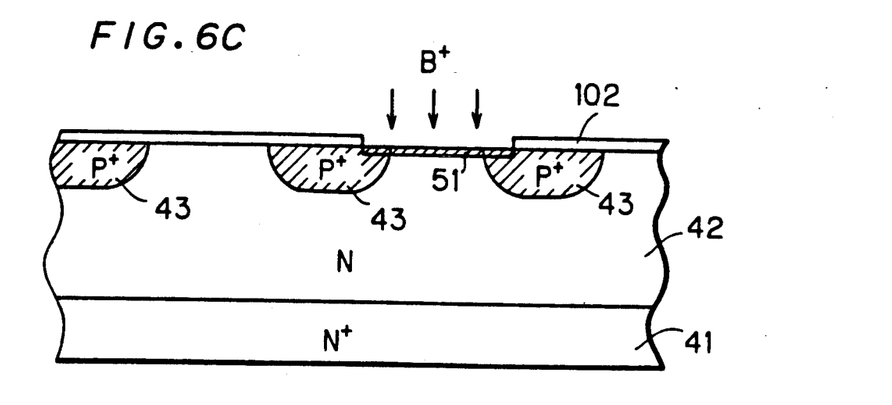

After that, as shown in FIG. 6C, P-type impurities such as boron are selectively introduced into specified portions of the N drift region 42 with another mask 102 so as to form the P regions 51 having a relatively low impurity concentration. The impurity concentration of the P region 51 is desirably about $1 \times 10^{15}$ to $1 \times 10^{17}$ cm$^{-3}$, while the diffusion depth is desirably about 1 to 3 μm. The thickness of the P region 51 is desirably shorter than the diffusion length of holes.

Figure 6D:
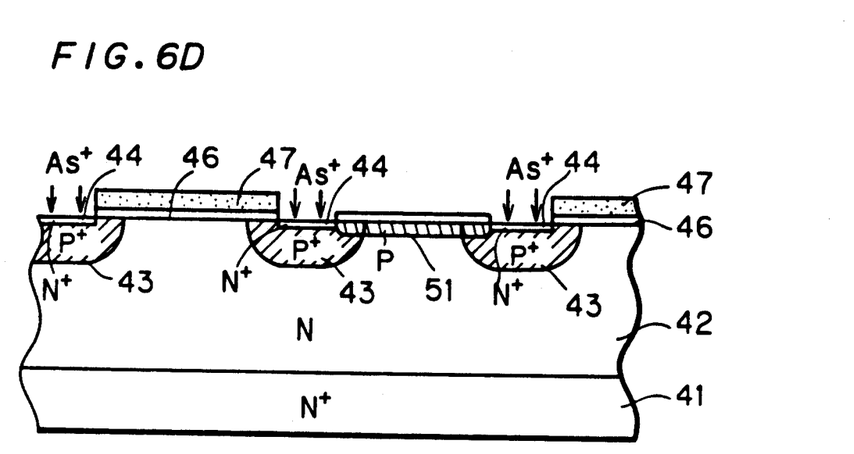

Then, as shown in FIG. 6D, after an oxidation film and a doped polysilicon film are formed one after another, the films are selectively etched to form the gate insulating films 46 and the gate electrodes 47 and make windows for forming the source regions 44. Through the windows, N-type impurities such as arsenic or phosphorus are selectively introduced into the surface of each P+ well region 43 by means of ion implantation, gas diffusion or the like to form the N+ source regions 44 in a self-alignment manner.

Figure 6E:
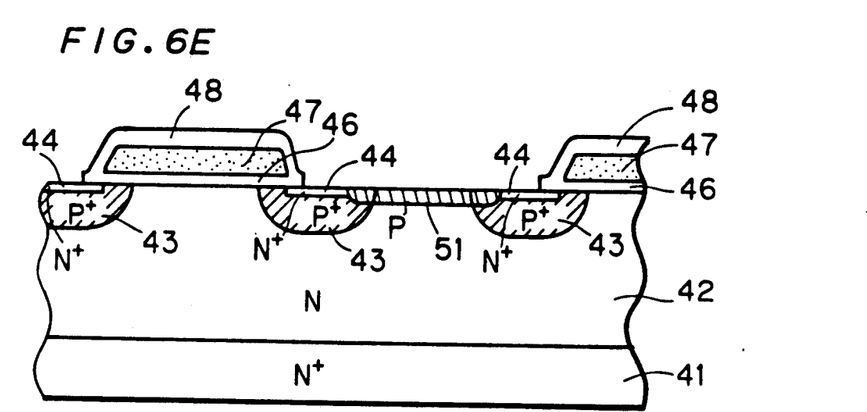
Figure 6F:
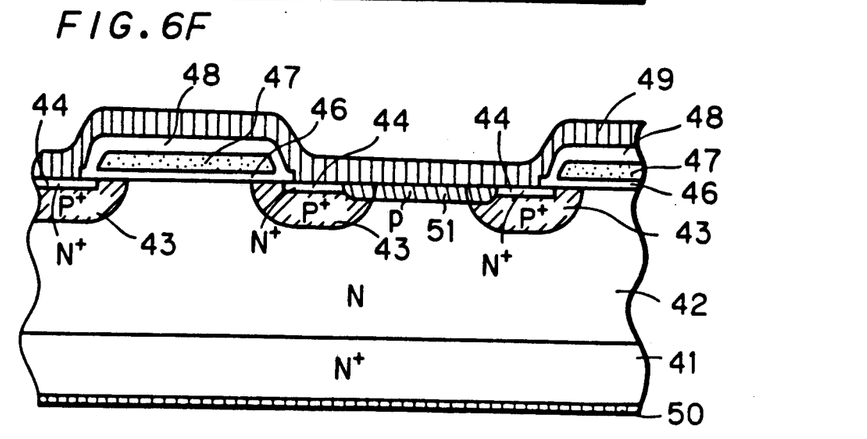

Then, as shown in FIG. 6E, the insulating film 48 for insulating the gate electrodes 47, after formed over the entire surface, is selectively etched to make contact holes for contact with the P+ well regions 43, the N+ source regions 44 and the P regions 51. Further, as shown in FIG. 6F, the source electrode 49 of metal is formed connecting with the P+ well regions 43, the N+ source regions 44 and the P regions 51 through the contact holes, while the drain electrode 50 of metal is formed on the bottom surface. In this way, the MOSFET structured as shown in FIG. 4 can be implemented.

Figure 7:
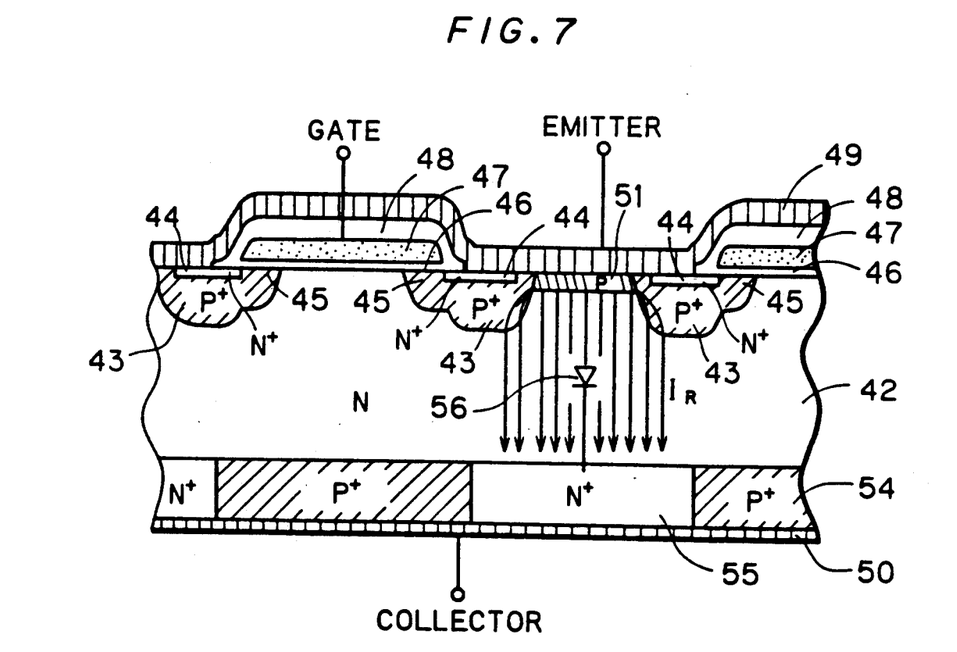
FIG. 7 is a sectional view showing a structure of a collector shorted IGBT as another embodiment of the semiconductor device according to the present invention.

FIG. 7 is a sectional view showing a structure of a shorted collector n-channel IGBT as another embodiment of the semiconductor device according to the present invention. The IGBT shown in FIG. 7 is different from the MOSFET shown in FIG. 4 in that P+ collector regions 54 and N+ collector shorting regions 55 are alternately disposed on the bottom surface of an N drift region 42 instead of the N+ drain region 41 in FIG. 4. Other structures are similar to those of the MOSFET shown in FIG. 4. The electrodes 49 and 50 serve as an emitter electrode and a collector electrode, respectively.

In the IGBT shown in FIG. 7, a PIN+ diode 56 similar to the diode 53 of the MOSFET shown in FIG. 4 is formed of a P region 51, the N drift region 42 and the N+ collector shorting region 55. Thus, for the same reason as stated above, the diode 56 requires a short reverse recovery time, and the IGBT can be easily applied to a high voltage applying use. Thus, in the inverter circuit shown in FIG. 1, the external free wheel diodes 9 to 12 are unnecessary when the IGBT shown in FIG. 7 is used instead of each of the power MOSFETs 1 to 4.

In the operation of the IGBT shown in FIG. 7, when a positive voltage is applied to gate electrodes 47, channel regions 45 are inverted into an N-type to form inversion layers, and a collector current flows from the collector electrode 50 to the emitter electrode 49 through the inversion layers. At this time, a low On state voltage is implemented by an effect of a conductivity modulation in the drift region 42. When a negative voltage is applied to the gate electrodes 47, the inversion layers of the channel regions 45 disappear, so that the IGBT turns Off. At this time, remaining carriers are rapidly drawn out through the turn-off N+ collector shorting regions 55, and hence a quick turn-off can be implemented.

In the above embodiment, although a square island-shaped cell configuration as shown in the plan view in FIG. 5 has been described, the present invention can be applied to devices of a non-square island-shaped cell configuration and a stripe-shaped cell configuration. In the case of the stripe-shaped cell configuration, cells corresponding to those in FIGS. 4 and 7 are provided extending like stripes in the direction orthogonal to the sheet of the drawings.

Although an n channel MOSFET and an n channel IGBT have been explained in the context of the above embodiments, the present invention can be applied to a p channel MOSFET and a p channel IGBT.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A semiconductor device, comprising:
   a first conductivity type semiconductor layer having first and second major surfaces;
   a second conductivity type first semiconductor region selectively formed in said first major surface of said semiconductor layer;
   said first semiconductor regions being composed of a first portion of relatively low impurity concentration and relatively small thickness existing in a center of said first semiconductor region and a second portion of relatively high impurity concentration and relatively large thickness existing adjacently to and outside said first portion, wherein said first portion of said first semiconductor region is smaller in thickness than a diffusion length of a hole;
   a first conductivity type second semiconductor region selectively formed in a surface of said second portion of said first semiconductor region;
   a surface portion of said second portion of said first semiconductor region between the first major surface of said semiconductor layer and said second semiconductor region being defined as a channel;
   an insulating film formed on said channel;
   a gate electrode formed on said insulating film;
   a first main electrode formed on said first and second semiconductor regions; and
   a second main electrode formed in a side of said second major surface of said semiconductor layer.

2. A semiconductor device in accordance with claim 1, further comprising:
   a first conductivity type third semiconductor region of higher impurity concentration than said semiconductor layer formed on said second major surface of said semiconductor layer; and
   a second conductivity type fourth semiconductor region formed on said second major surface of said semiconductor layer, wherein
   said second main electrode is formed on said third and fourth semiconductor regions.

3. A semiconductor device in accordance with claim 1, wherein
   said first semiconductor region is island-shaped.

4. A semiconductor device in accordance with claim 3, wherein
   said first semiconductor region has a configuration of a square.

5. A semiconductor device in accordance with claim 4, wherein
   said second portion of said first semiconductor region and said second semiconductor region have a configuration of a square ring.

6. A semiconductor device in accordance with claim 1, wherein
   said first portion of said first semiconductor region is $1 \times 10^{15}$ to $1 \times 10^{17}$ cm$^{-3}$ in impurity concentration and 1 to 3 μm in thickness.

7. A semiconductor device, comprising:
   a first conductivity type semiconductor layer having first and second major surfaces;
   second conductivity type first semiconductor regions selectively formed in said first major surface of said semiconductor layer, each first semiconductor region being in the configuration of a square island;
   each of said first semiconductor regions being composed of a first portion of relatively low impurity concentration and relatively small thickness existing in a center of each of said first semiconductor regions and a second portion of relatively high impurity concentration and relatively large thickness existing adjacent to and outside said first portion, said second portion being in the configuration of a square ring;
   a first conductivity type second semiconductor region selectively formed in a surface of said second portion of each of said first semiconductor regions and being in the configuration of a square ring;
   a surface portion of said second portion of each of said first semiconductor regions between the first major surface of said semiconductor layer and said second semiconductor region being defined as a channel;
   an insulating film formed on said channel;
   a gate electrode formed on said insulating film;
   a first main electrode formed on said first and second semiconductor regions; and
   a second main electrode formed in a side of said second major surface of said semiconductor layer.

8. A semiconductor device in accordance with claim 7, wherein
   said first portion of each said first semiconductor region is larger in thickness than a diffusion length of a hole.

9. A method of manufacturing a semiconductor device, comprising the steps of:
   preparing a first conductivity type semiconductor layer having first and second major surfaces;
   selectively forming a second conductivity type first semiconductor region in said first major surface of said semiconductor layer;
   said first semiconductor region being composed of a first portion of relatively low impurity concentration and relatively small thickness existing in a center of said first semiconductor region and a second portion of relatively high impurity concentration and relatively large thickness existing adjacently to and outside said first portion, wherein said first portion of said first semiconductor region is smaller in thickness than a diffusion length of a hole;
   selectively forming a first conductivity type second semiconductor region in a surface of said second portion of said first semiconductor region;
   a surface portion of said second portion of said first semiconductor region between the first major surface of said semiconductor layer and said second semiconductor region being defined as a channel;
   forming an insulating film on said channel;
   forming a gate electrode on said insulating film;
   forming a first main electrode on said first and second semiconductor regions; and
   forming a second main electrode in a side of said second major surface of said semiconductor layer.

10. A method of manufacturing a semiconductor device in accordance with claim 9, further comprising the steps of:
    forming a first conductivity type third semiconductor region of higher impurity concentration than said semiconductor layer on said second major surface of said semiconductor layer; and forming a second conductivity type fourth semiconductor region on said second major surface of said semiconductor layer, wherein said second main electrode is formed on said third and fourth semiconductor regions.

11. A method of manufacturing a semiconductor device in accordance with claim 9, wherein
said second semiconductor region is formed in a self-alignment manner by using said gate electrode as a mask.

* * * * *